(12) United States Patent
Yokokawa et al.

(10) Patent No.: US 11,569,426 B2
(45) Date of Patent: Jan. 31, 2023

(54) LIGHT IRRADIATION UNIT AND LIGHT IRRADIATION DEVICE

(71) Applicant: Ushio Denki Kabushiki Kaisha, Tokyo (JP)

(72) Inventors: Yoshihisa Yokokawa, Tokyo (JP); Yasushi Omae, Tokyo (JP); Yusuke Miyauchi, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 144 days.

(21) Appl. No.: 17/185,131

(22) Filed: Feb. 25, 2021

(65) Prior Publication Data
US 2021/0288236 A1    Sep. 16, 2021

(30) Foreign Application Priority Data

Mar. 16, 2020    (JP)    .............................. JP2020-045422

(51) Int. Cl.
| | |
|---|---|
| *H01L 33/64* | (2010.01) |
| *H01L 25/075* | (2006.01) |
| *H05B 3/00* | (2006.01) |
| *H01L 33/58* | (2010.01) |
| *F26B 3/28* | (2006.01) |
| *H01L 33/48* | (2010.01) |

(52) U.S. Cl.
CPC .............. *H01L 33/642* (2013.01); *F26B 3/28* (2013.01); *H01L 25/0753* (2013.01); *H01L 33/486* (2013.01); *H01L 33/58* (2013.01); *H05B 3/0047* (2013.01)

(58) Field of Classification Search
CPC ..... H01L 33/642; H01L 33/486; H01L 33/58; H01L 25/0753; F26B 3/28; H05B 3/0047
See application file for complete search history.

(56) References Cited

FOREIGN PATENT DOCUMENTS

| | | | | |
|---|---|---|---|---|
| CN | 109723982 A | * | 5/2019 | ............ F21V 29/505 |
| DE | 102018126750 A1 | * | 5/2019 | ............ F21V 29/505 |
| JP | 2012-003840 A | | 1/2012 | |
| JP | 2012003840 A | * | 1/2012 | ................ F21S 4/28 |

(Continued)

OTHER PUBLICATIONS

Office Action dated Oct. 22, 2021 for the corresponding JP patent application No. JP2020-045422.

(Continued)

*Primary Examiner* — Mary Ellen Bowman
(74) *Attorney, Agent, or Firm* — Kenichiro Yoshida

(57) ABSTRACT

A light irradiation unit includes a substrate having a longitudinal direction, the longitudinal direction being a first axis direction; multiple light sources arranged along the first axis direction on a first surface of the substrate; a heat dissipation member arranged on a second surface of the substrate opposite to the first surface; and a housing having a pair of first side surfaces holding the heat dissipation member therebetween in a second axis direction orthogonal to the first axis direction along the first surface. The substrate has, at an end portion in the first axis direction, an end surface intersecting the first axis direction. The location of the end surface in the first axis direction is near an edge of the first side surface along the first axis direction. The end surface is exposed from the housing or covered by a detachable protection member.

9 Claims, 7 Drawing Sheets

(56) References Cited

FOREIGN PATENT DOCUMENTS

| | | | |
|---|---|---|---|
| JP | 2013-168330 A | | 8/2013 |
| JP | 5907291 B1 | | 4/2016 |
| JP | 2016-157889 A | | 9/2016 |
| JP | 2016157889 A | * | 9/2016 |
| JP | 2017-183234 A | | 10/2017 |
| JP | 2017183234 A | * | 10/2017 |
| JP | 2021-082423 A | | 5/2021 |
| WO | WO-2018047629 A1 | * | 3/2018 .......... B01J 19/0013 |

OTHER PUBLICATIONS

Japanese Opposition stated in the written opposition filed on Oct. 31, 2022 to Japanese Patent JP7037771 B, which corresponds to U.S. Appl. No. 17/185,131.

* cited by examiner

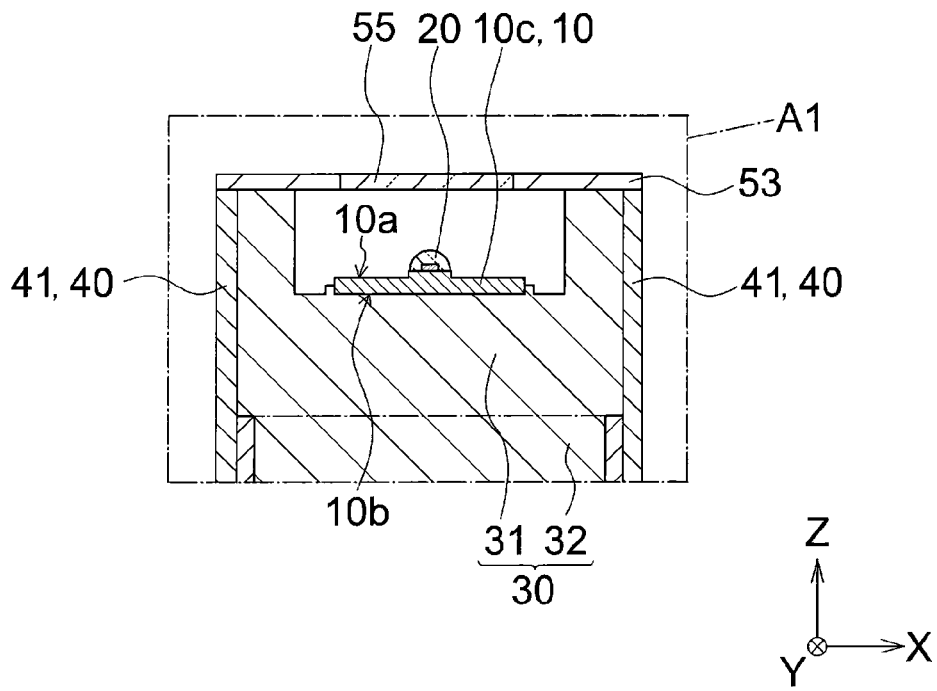
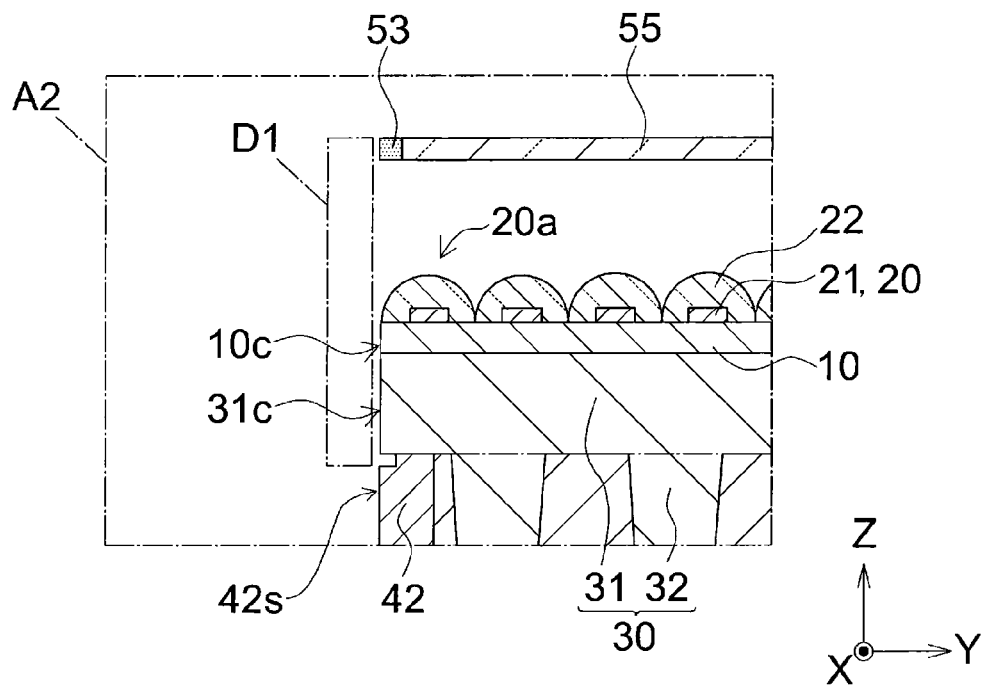

LIGHT IRRADIATION UNIT AND LIGHT IRRADIATION DEVICE

CROSS REFERENCES TO RELATED APPLICATIONS

The present invention contains subject matter related to Japanese Patent Application No. 2020-045422 filed in the Japan Patent Office on Mar. 16, 2020, the entire contents of which are incorporated herein by reference.

BACKGROUND OF THE INVENTION

1. Field of the Invention

The present invention relates to a light irradiation unit and a light irradiation device.

2. Description of the Related Art

In recent years, a light irradiation device using light sources such as LEDs has been used for curing printing ink, curing an adhesive used for bonding display manufacturing substrates, or the like. Since the sizes of printing sheets and display substrates to be irradiated with light are various, there is a demand in the market to provide, as a light irradiation device to be incorporated in a printing-ink curing apparatus (printing apparatus) or a display-substrate bonding apparatus (display manufacturing apparatus), a light irradiation device capable of flexibly changing an irradiation area in accordance with the size of an irradiation object.

To respond to this demand, for example, there is a known light irradiation device in which, as illustrated in FIG. 11, a required number (two in FIG. 11) of light irradiation units (90a and 90b) that emit light of a prescribed size from optical members 97 are connected in one direction (Y-axis direction) to be able to form an irradiation area of a size that matches the size of an irradiation object (Japanese Patent No. 5907291). Japanese Patent No. 5907291 describes that a larger number of light sources are arranged in a region of an end portion of each of the light irradiation units (90a and 90b) in the Y-axis direction than in a center region thereof to suppress a local illuminance decrease (ripple) in the vicinity of a boundary at which the light irradiation units are connected.

SUMMARY OF THE INVENTION

Further improvement in illuminance uniformity of an irradiation area is expected in the market. To respond to such an expectation, the inventors of the present invention first analyzed factors of a decrease in illuminance in a region of an end portion of a light irradiation unit. As a result of the analysis, the factors described below have been found.

FIG. 12 is an enlarged view of the B1 region (a section of a region in which the light irradiation units (90a and 90b) are connected, the section being parallel to the YZ plane) in FIG. 11. The light irradiation unit 90a has a side surface 91a of a housing, and the light irradiation unit 90b has a side surface 91b of a housing. The side surfaces (91a and 91b) of the housings are present between, among multiple light sources of the light irradiation unit 90a, a light source $95a_1$ closest to the light irradiation unit 90b and, among multiple light sources of the light irradiation unit 90b, a light source $95b_1$ closest to the light irradiation unit 90a.

As a result of analyzing emission light of the light sources ($95a_1$ to $95a_3$) of the light irradiation unit 90a, it has been found that part of a light flux $L_1$ emitted from the light source $95a_1$ and a light source $95a_2$ near an end portion of a substrate 94 is blocked by an $E_1$ region of the side surface 91a of the housing. Specifically, of the light flux $L_1$ emitted from the light source $95a_1$ and the light source $95a_2$ near the end portion, a light beam in an optical axis direction (+Z direction) is emitted without any problem. A light beam that travels toward the side of the light irradiation unit 90b with respect to the optical axis is, however, blocked by the $E_1$ region of the side surface 91a of the housing, and illuminance in the traveling direction of the light beam that travels toward the side of the light irradiation unit 90b decreases. As a result, an irradiation region of the light flux emitted from the light source $95a_1$ is narrowed from an ideal region R1 to an actual region R2.

Meanwhile, most of the emission light of a light source $95a_3$ is not blocked by the side surface 91a of the housing since a light source $95a_3$, which is away from the end portion of the substrate 94, is far from the side surface 91a of the housing. Therefore, illuminance of light transmitted through the optical member 97 at a part (a region of an end portion of the light irradiation unit 90a in the Y-axis direction) of the side surface 91a of the housing is decreased compared with the illuminance in a center region of the light irradiation unit 90a in the Y-axis direction. Such an illuminance decrease becomes more remarkable as the light source $95a_1$ and the side surface 91a of the housing are arranged closer to each other, and as the side surface 91a of the housing is designed to be longer. The same applies to the light irradiation unit 90b.

On the basis of the aforementioned factor analysis that the irradiation region of the light flux emitted from the light source near the end portion of the substrate is narrowed by the side surface 91a of the housing, the inventors of the present invention examined means for suppressing an illuminance decrease at an end portion of a substrate and improving illuminance uniformity with an approach that differs from that of the means described in Japanese Patent No. 5907291. An object of the present invention is to provide a light irradiation unit that achieves high illuminance uniformity in an irradiation area of a light irradiation device formed by connecting light irradiation units, and a light irradiation device in which the light irradiation units are connected.

A light irradiation unit includes
a substrate having a longitudinal direction, the longitudinal direction being a first axis direction;
multiple light sources arranged along the first axis direction on a first surface of the substrate;
a heat dissipation member arranged on a second surface of the substrate opposite to the first surface; and
a housing having a pair of first side surfaces that hold the heat dissipation member therebetween in a second axis direction orthogonal to the first axis direction along the first surface,
in which the substrate has an end surface at an end portion along the first axis direction, the end surface intersecting the first axis direction, a location of the end surface in the first axis direction being near an edge of the first side surface along the first axis direction, and
in which the end surface is exposed from the housing or covered by a detachable protection member.

Although details will be described later, when connecting the light irradiation units in the first axis direction, it is possible to expose the end surfaces of the substrates from the housings, and thus, the housings are not present between the light irradiation units adjacent to each other. Consequently, emission light from the light sources near the end portions of the substrates is not blocked by the housings, and illuminance uniformity of an irradiation area of a light irradiation device formed by connecting the light irradiation units is improved.

The end surface may be provided at each of two ends of the substrate relating to the first axis direction, and the end surface provided at each of the two ends may be exposed from the housing.

The housing may have a second side surface in the first axis direction, the second side surface being arranged to cover at least a portion of the heat dissipation member and not to cover the substrate. The second side surface may include two side surfaces in the first axis direction to hold at least a portion of the heat dissipation member therebetween.

The multiple light sources may be arranged at an interval of a (mm) in the first axis direction, and, when an interval in the first axis direction between the end surface that is exposed or covered by the detachable protection member and a center of, among the multiple light sources, a light source closest to the end surface is b (mm), a relationship of b=a/2 may be satisfied.

The light irradiation unit may include an optical member that is supported by a support member fixed to the housing or to the heat dissipation member and that transmits light emitted from the multiple light sources, and a length of the optical member in the first axis direction may be identical to a length of the substrate in the first axis direction.

A light irradiation device includes light irradiation units each of which is the above-described light irradiation unit, the light irradiation units being connected in the first axis direction, in which the end surfaces of the substrates arranged to face each other in the light irradiation units adjacent to each other are in contact with or close to each other in a state of each being exposed or in a state in which the protection members are detached.

In the light irradiation device, the light irradiation units may each include an optical member that is supported by a support member fixed to the housing or to the heat dissipation member and that transmits light emitted from the multiple light sources, and the optical members of the light irradiation units adjacent to each other may be in contact with each other. The heat dissipation members of the light irradiation units adjacent to each other may be in contact with each other.

According to the above, it is possible to provide a light irradiation unit that achieves high illuminance uniformity in an irradiation area formed with the light irradiation units connected and a light irradiation device in which the light irradiation units are connected.

BRIEF DESCRIPTION OF THE DRAWINGS

FIG. 2 is an enlarged view of the A1 region of FIG. 1.
FIG. 3 is an enlarged view of the A2 region of FIG. 1.

DESCRIPTION OF THE PREFERRED EMBODIMENTS

First Embodiment

Figure 1:
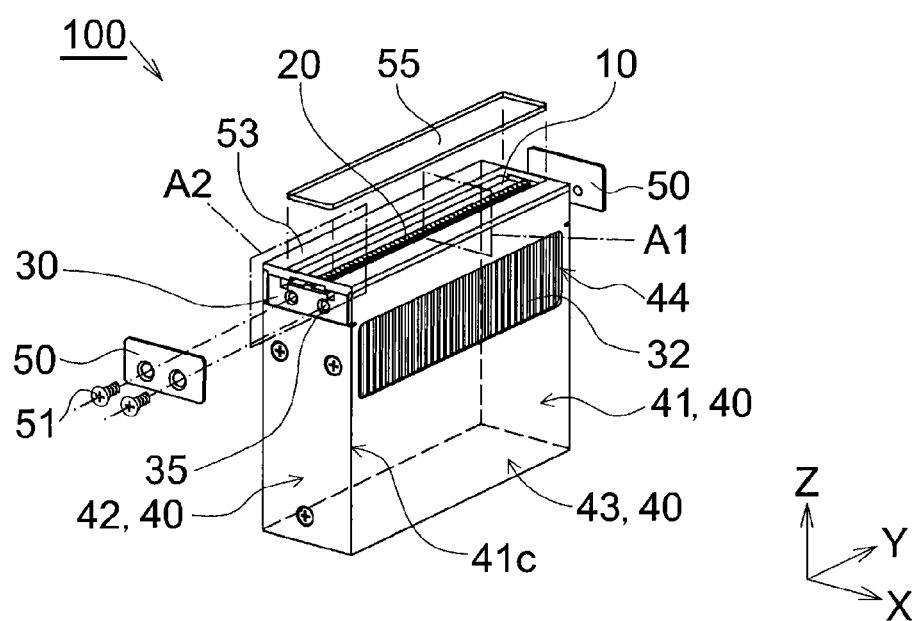
FIG. 1 is a perspective view of a light irradiation unit according to a first embodiment.

One embodiment of a light irradiation unit will be described with reference to the drawings. The drawings disclosed in the present specification are merely schematically illustrated. That is, the dimensional ratios in the drawings and the actual dimensional ratios are not necessarily in coincidence with each other, and the dimensional ratios are not necessarily in coincidence with each other among the drawings.

Hereinafter, description will be provided with reference to the XYZ coordinate system, as appropriate. In the present specification, when positive and negative directions are to be distinguished from each other in the expression of directions, the directions are described with positive and negative signs, for example, as "+X direction" and "−X direction". When a direction is to be expressed without distinguishing the positive and negative directions, the direction is simply described as "X direction". That is, in the present specification, when a direction is simply described as the "X direction", the direction includes both the "+X direction" and the "−X direction". The same applies to the Y direction and the Z direction.

With reference to FIG. 1, one embodiment of a light irradiation unit will be described. FIG. 1 is a perspective view of a light irradiation unit 100. The light irradiation unit 100 according to the present embodiment includes a substrate 10 having a longitudinal direction, the longitudinal direction being a Y-axis direction (first axis direction), multiple light sources 20 arranged along the Y-axis direction, a heat dissipation member 30, a housing 40, a detachable protection member 50, an optical member 55 that transmits emission light of the light sources 20, and a support member 53 that supports the optical member 55. In FIG. 1, the light irradiation unit 100 is illustrated in a state in which the optical member 55 is detached therefrom to illustrate the substrate 10 and the light sources 20 so as to be easily viewed. In addition, in order to illustrate the heat dissipation member 30 so as to be easily viewed, the light irradiation unit 100 is illustrated in a state in which the protection member 50 is detached therefrom.

FIG. 2 is an enlarged view of a section of the A1 region parallel to the XZ plane of FIG. 1. FIG. 3 is an enlarged view of a section of the A2 region parallel to the YZ plane of FIG. 1. In FIG. 2 and FIG. 3, a state in which the optical member 55 is attached to the light irradiation unit 100 is illustrated. With reference to FIG. 2 and FIG. 3, in addition to FIG. 1, description of the light irradiation unit 100 will be continued.

Referring to FIG. 2, the substrate 10 has a first surface 10a on the +Z side, a second surface 10b on the −Z side, which is opposite to the first surface 10a, and an end surface 10c located at an end portion relating to the −Y direction and intersecting (or orthogonal to) the Y-axis direction. The substrate 10 also has an end surface (not illustrated) opposite to the end surface 10c, the end surface being located at an end portion relating to the +Y direction and intersecting (or orthogonal to) the Y-axis direction. The light sources 20 are arranged on the first surface 10a of the substrate 10, and the heat dissipation member 30 is arranged on the second surface 10b. Other members (for example, grease for improving thermal conductivity) may be arranged between the light sources 20 and the first surface 10a and between the heat dissipation member 30 and the second surface 10b.

When emission light emitted from the light sources 20 toward the +Z side is transmitted through the optical member 55, the emission light becomes output light from the light irradiation unit 100. In the present embodiment, LEDs 21 that emit ultraviolet light are used as the light sources 20. As illustrated in FIG. 3, each LED is covered by a lens 22 disposed on the LED 21. In the present embodiment, the lenses 22 are arranged in the Y-axis direction almost without any gaps, and no gap is present between an end of the lens of a light source 20a located at a furthest end and the end surface 10c of the substrate 10. However, each of the type (LED, LD, and the like) and the wavelength of the light sources 20, the configuration of members (including the lens) of each light source, the interval between the lenses 22, the size of the gap between the end surface 10c of the substrate 10 and the end of the lens of the light source 20a located at the furthest end, and the arrangement interval between the light sources 20 are presented as examples and are not limited thereto.

The heat dissipation member 30 is used to remove heat generated at the light sources 20. Referring to FIG. 3, the heat dissipation member 30 is constituted by a body 31 located close to the second surface 10b, and multiple fins 32 projecting from the body 31 in the −Z direction. The length in the Y-axis direction of a region in which the multiple fins 32 are arranged is smaller than the length of the body 31 in the Y-axis direction.

Referring to FIG. 2, the housing 40 has a pair of first side surfaces 41 that hold the heat dissipation member 30 therebetween in an X-axis direction (second axis direction) orthogonal to the Y-axis direction along the first surface 10a. That is, the pair of first side surfaces 41 hold the entirety of the heat dissipation member 30 therebetween from the +X side and the −X side. The first side surfaces 41 according to the present embodiment are parallel to the YZ plane.

The first side surfaces 41 each have a heat-dissipation opening 44 (refer to FIG. 1) arranged close to the fins 32. The heat accumulated at the fins 32 is discharged through the opening 44 to the outside of the light irradiation unit 100. A cooling fan (not illustrated) may be arranged in the housing 40 of the light irradiation unit 100 to accelerate discharge of heat of the fins 32.

Referring to FIG. 1 and FIG. 3, the housing 40 has a pair of second side surfaces 42 that hold the fins 32, which is part of the heat dissipation member 30, therebetween in the Y-axis direction. That is, the pair of second side surfaces 42 hold the fins 32 of the heat dissipation member 30 therebetween from the +Y side and the −Y side. The second side surfaces 42 according to the present embodiment are parallel to the XZ plane.

The housing 40 has a bottom surface 43 parallel to the XY plane (refer to FIG. 1). The bottom surface 43 may be provided with an opening (not illustrated) for taking air for cooling into the light irradiation unit 100.

The optical member 55 is constituted by a rectangular glass plate in the present embodiment, the support member 53 has a frame shape that surrounds the four sides of the rectangular glass plate, and the support member 53 supports the four sides of the optical member 55. In the support member 53, a frame (the portion indicated with dots in FIG. 3) extending in the X-axis direction at two ends in the Y-axis direction is preferably formed to be thin not to obstruct emission light. As illustrated in FIG. 2, the support member 53 is fixed in contact with the heat dissipation member 30. In the present embodiment, the support member 53 is in contact with the first side surfaces 41 of the housing 40.

The location of the end surface 10c of the substrate 10 in the Y-axis direction is near a surface 42s (refer to FIG. 3) of the second side surface 42 or an edge 41c (refer to FIG. 1) of the first side surface 41 relating to the Y-axis direction. That is, the substrate 10 can be extended to an end of the light irradiation unit 100 in the Y-axis direction so that the end surface 10c of the substrate 10 is located in a nearer range than the surface 42s or the edge 41c. Near means that the end surface 10c is present in a range of 10 mm or less, preferably in a range of 5 mm or less, and more preferably in a range of 3 mm or less from the edge 41c. This means that the light sources 20 are arranged at an end portion of the light irradiation unit 100, and an illuminance decrease in the region of the end portion of the light irradiation unit 100 is thereby suppressed.

The substrate 10 may project from the housing 40 in a range in which the end surface 10c of the substrate 10 is located in a nearer range than the surface 42s or the edge 41c. The light sources 20 are arranged at a furthest possible end of the light irradiation unit 100 to easily suppress an illuminance decrease in the region of the end portion of the light irradiation unit 100.

The substrate 10 may be retractable into the light irradiation unit 100 in a range in which the end surface 10c of the substrate 10 is located in a nearer range than the surface 42s or the edge 41c. The light irradiation units 100 are consequently not easily broken by accidental contact with the substrate 10 when the light irradiation units 100 are to be connected.

In the present embodiment, since the length in the Y-axis direction of the region in which the multiple fins 32 are arranged is smaller than the length of the body 31 in the Y-axis direction, when the second side surface 42 of the housing 40 is arranged on the outer side of the multiple fins 32 in the Y-axis direction, the surface 42s of the second side surface 42 can be formed to be located at the same location as the location of an end surface 31c of the heat dissipation member 30 in the Y-axis direction (so as to be flush therewith). The location in the Y-axis direction of the end surface 10c of the substrate 10 or the end surface 31c of the heat dissipation member 30 can be in coincidence with the location in the Y-axis direction of the surface 42s or the edge 41c.

The second side surface 42 covers the fins 32, which are at least part of the heat dissipation member 30, and does not cover the end surface 31c of the heat dissipation member 30 and the end surface 10c of the substrate 10. Thus, when the light irradiation unit 100 is to be used or transported as a single body, a protection member for covering and protecting the end surface 10c of the substrate 10 and the end surface 31c of the heat dissipation member 30 may be provided optionally. The D1 region of FIG. 3 indicates a location where the protection member 50 is attached when the protection member 50 is attached to the light irradiation unit 100. When the protection member 50 is not attached to the light irradiation unit 100 or when the protection member 50 is not provided, the end surface 10c of the substrate 10 and the end surface 31c of the heat dissipation member 30 are exposed from the housing 40.

As described above, the light irradiation unit 100 having a form in which the location of the end surface 10c of the substrate 10 in the Y-axis direction is present near the edge 41c of the first side surfaces 41 relating to the Y-axis direction or near the surface 42s of the second side surface 42 and in which the end surface 10c is exposed from the housing 40 or covered by the detachable protection member 50 improves illuminance uniformity in an irradiation area of a light irradiation device when the light irradiation device is formed by connecting the light irradiation units 100 in one direction. A reason for this will be described with reference to FIG. 4 and FIG. 5.

Figure 4:
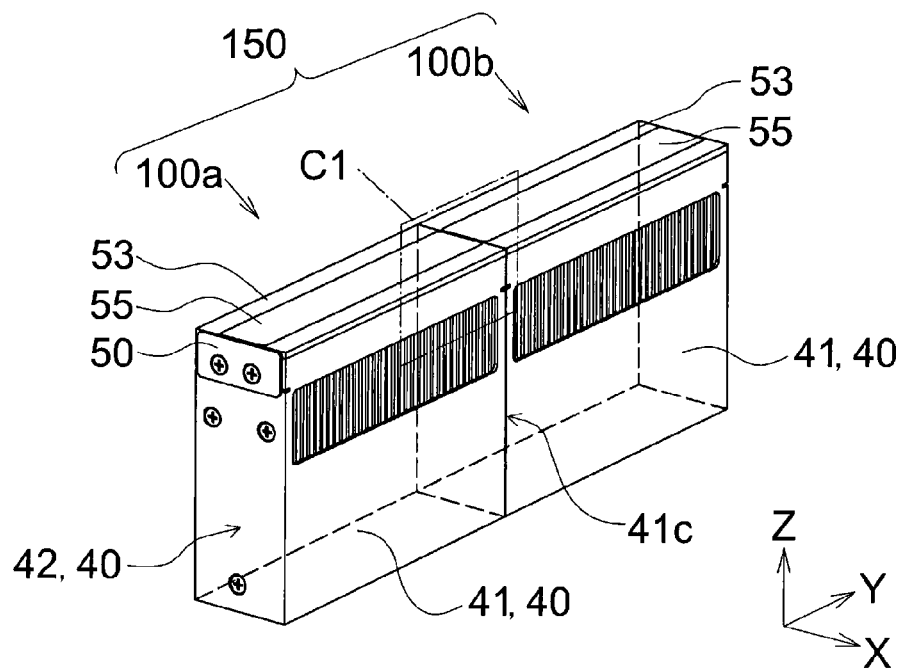
FIG. 4 is a perspective view of a light irradiation device in which light irradiation units are connected in one direction.

FIG. 4 is a perspective view of a light irradiation device 150 in which the light irradiation units 100 are connected in one direction (Y-axis direction). The light irradiation unit 100 arranged on the −Y side is referred to as a light irradiation unit 100a, and the light irradiation unit 100 arranged on the +Y side is referred to as a light irradiation unit 100b.

Figure 5:
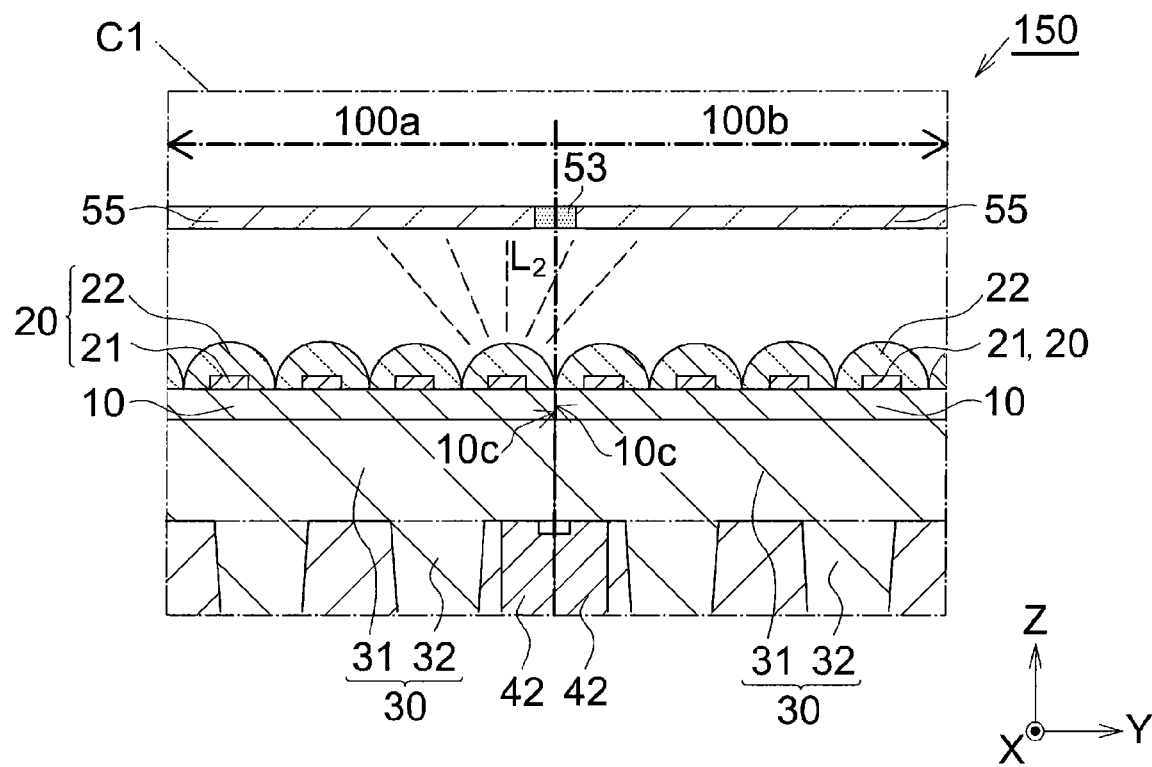
FIG. 5 is an enlarged view of the C1 region of FIG. 4.

FIG. 5 is an enlarged view of the C1 region of FIG. 4. The C1 region indicates a section of a region in which the light irradiation unit 100a and the light irradiation unit 100b are connected, the section being parallel to the YZ plane. When the protection members 50 are included, respective end surfaces 10c can be arranged in contact with or close to each other with the protection members 50 detached, as illustrated in FIG. 5. Thus, the intervals between the light sources 20 in the connection region are not excessively increased. The second side surfaces 42 are not present between the two light irradiation units (100a and 100b) since the substrates 10 are exposed from the second side surfaces 42 of the housings 40. Therefore, emission light (for example, a light flux $L_2$ in FIG. 5) from the light sources 20 is not blocked by the second side surfaces 42.

Consequently, a difference between the light amount of emission light from the light sources in the area of an end portion of each substrate 10 and the light amount of emission light from the light sources in a center region of each substrate 10 is reduced, which improves illuminance uniformity in an irradiation area as the light irradiation device 150.

Referring to FIG. 3, the location in the Y-axis direction of the end surface 31c of the heat dissipation member 30 is in coincidence with the location in the Y-axis direction of the end surface 10c in the present embodiment. Consequently, as seen in FIG. 5, the bodies 31 of the heat dissipation members 30 of the light irradiation units (100a and 100b) adjacent to each other also can be in contact with each other. Consequently, when variation in heat is generated between respective heat dissipation members 30 of the light irradiation units (100a and 100b) in the light irradiation device 150, heat is transmitted from the heat dissipation member having a high temperature to the heat dissipation member having a low temperature, and the variation in the heat between the heat dissipation members is reduced.

The end surfaces 10c of the substrates 10 may be arranged further inside the light irradiation units (100a and 100b) than the end surfaces 31c of the heat dissipation members 30. Consequently, when the light irradiation units 100 are to be connected, the end surfaces 10c of the substrates 10 do not come into contact with each other easily, even when the end surfaces 31c of the heat dissipation members 30 come into contact with each other, and a breakage due to accidental contact between the substrates 10 can be suppressed.

With FIG. 3, the end surface 10c of the substrate 10 on the −Y side has been described. The above description also applies to the end surface that is on the +Y side and that forms a pair with the end surface 10c.

As described above, the protection member 50 optionally provided at the light irradiation unit 100 can protect the end surface 10c of the substrate 10 and the end surface 31c of the heat dissipation member 30 when the light irradiation unit 100 is used or transported as a single body. When the protection member 50 is attached to the D1 region (refer to FIG. 3), the protection member 50 covers from the support member 53 to the substrate 10 and thus can separate a space in which the substrate 10 is arranged from the outside. It is thus possible to reduce a risk of an operator accidentally touching the substrate 10 and receiving an electric shock and to prevent fine particles such as dust from adhering to the substrate 10, the light sources 20, and the inner surface of the optical member 55. Of course, the light irradiation unit 100 may be configured with the end surface 10c of the substrate 10 not covered by the protection member 50. In this case, it is possible to connect the light irradiation units 100 without performing work of detaching the protection member 50.

The protection member 50 may be made of metal or made of resin. As a method of detachably fixing the protection member 50, as illustrated in FIG. 1, a screw hole 35 is provided in the body 31 of the heat dissipation member 30 in the present embodiment, and the protection member 50 is fixed to the heat dissipation member 30 by using a screw 51. Consequently, it is possible to position and fix the protection member 50 with high precision. A connectable screw such as a nipple may be inserted into the screw hole 35 in the body 31 and used for connecting the light irradiation units 100.

For fixing the protection member 50, a method other than the screw 51, for example, an adhesive tape or the like may be employed. The fixing destination of the protection member 50 may be the housing 40. Alternatively, the protection member 50 itself may be an adhesive tape.

Second Embodiment

Figure 6:
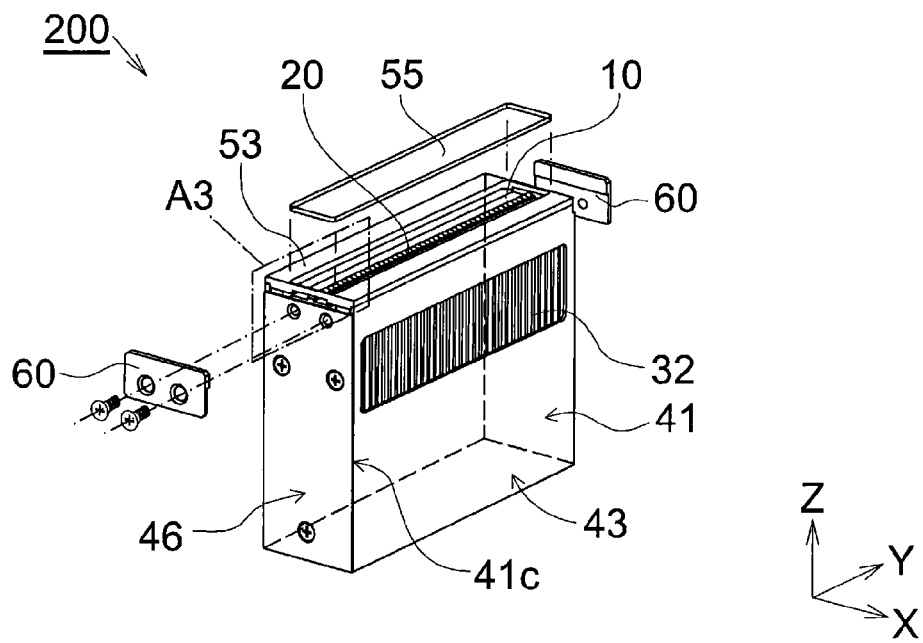
FIG. 6 is a perspective view of a light irradiation unit according to a second embodiment.
Figure 7:
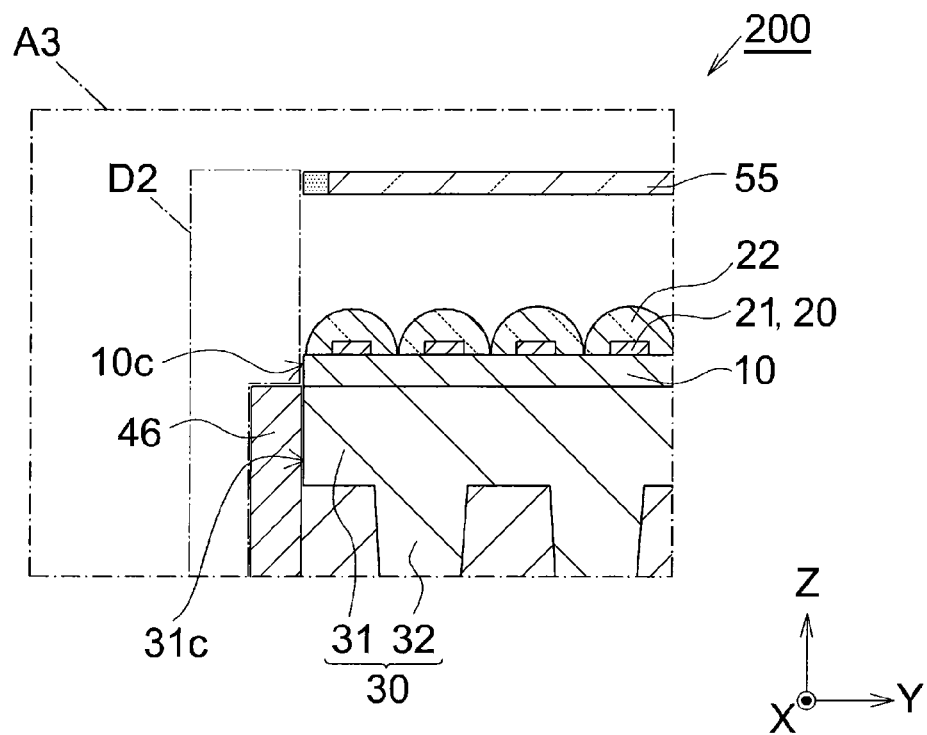
FIG. 7 is an enlarged view of the A3 region of FIG. 6.

A light irradiation unit according to a second embodiment will be described. Matters other than the matters described below can be embodied similarly to the first embodiment. The same applies to a third embodiment and subsequent embodiments. FIG. 6 is a perspective view of a light irradiation unit 200. FIG. 7 is an enlarged view of a section of the A3 region parallel to the YZ plane of FIG. 6.

In the light irradiation unit 200, a second side surface 46 covers the entirety of the heat dissipation member 30, that is, both the body 31 (end surface 31c) and the fins 32. The D2 region is a region in which a protection member 60 is fixed. The location of the end surface 10c of the substrate 10 in the Y-axis direction and the location of the end surface 31c of the body 31 are in coincidence with each other. When the light irradiation units 200 are to be connected in the Y-axis direction, the end surface 10c of the substrate 10 is located inside (the +Y side from the edge 41c of the first side surfaces 41) the light irradiation unit 200 by an amount of the thickness of the second side surface 46. The end surface 10c is, however, located near the edge 41c of the first side surfaces 41 in the Y-axis direction, even when the end surface 10c is located inside by the amount of the thickness of the second side surface 46, since the thickness of the second side surface 46 is thin. As described above, an effect of the end surface 10c of the substrate 10 being located inside the light irradiation unit 200 can suppress a breakage due to accidental contact between the substrates 10.

Third Embodiment

Figure 8:
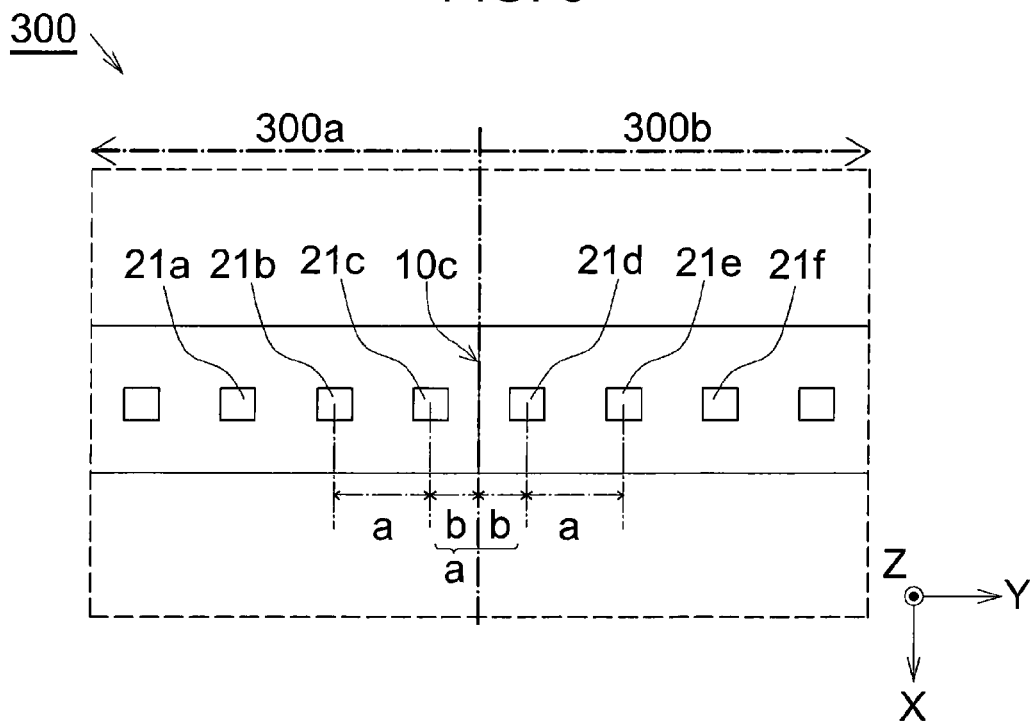
FIG. 8 is an enlarged view in which mutually adjacent parts of two light irradiation units of a light irradiation device according to a third embodiment are viewed from the +Z side toward the −Z side.

FIG. 8 is an enlarged view in which only the connection part of two light irradiation units (300a and 300b) in the light irradiation device 300 according to the third embodiment is viewed from the +Z side toward the −Z side. For convenience of explanation, the optical member 55 and the lens 22 provided for each of the light sources 20 are not illustrated.

In the light irradiation device 300, the light irradiation units (300a and 300b) having the same specifications are arranged such that the end surfaces 10c thereof are in contact with each other. LED chips (21a to 21c and 21d to 21f) in the light irradiation units are arranged at regular intervals of a (mm) in the Y-axis direction. An interval in the Y-axis direction between the end surface 10c and the center of, among the LED chips (21a to 21f), the LED chips (21c and 21d) closest to the end surface 10c is b (mm). The relationship of b=a/2 is satisfied.

In the light irradiation device 300 in which the light irradiation units (300a and 300b) are connected to satisfy the above-described relationship, the intervals of the LED chips (21a to 21f) are maintained at the regular intervals of a (mm), even at a place where the light irradiation units (300a and 300b) are connected. Therefore, illuminance uniformity of an irradiation area as the light irradiation device 300 is improved. The above-described relationship is, however, not required to be strictly satisfied, and design errors are allowable.

Fourth Embodiment

Figure 9:
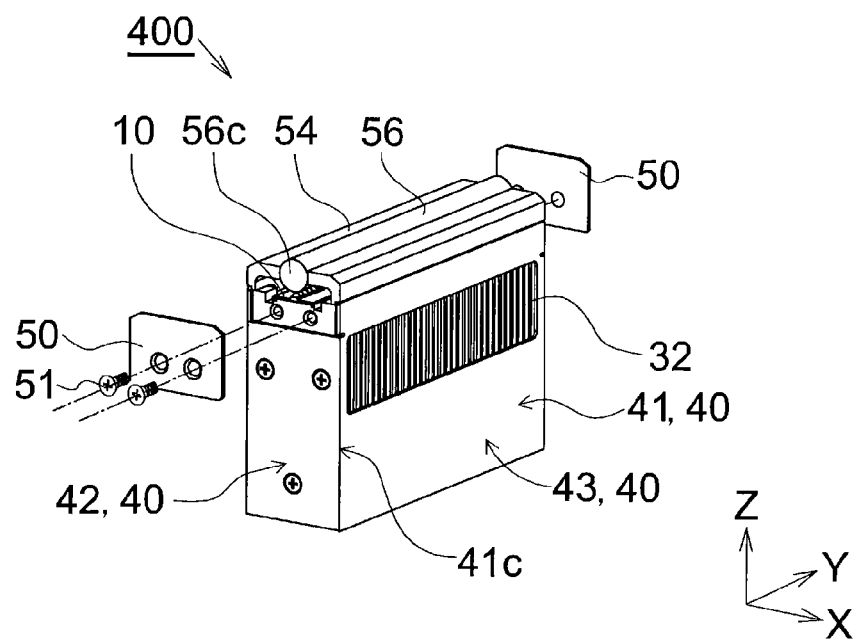
FIG. 9 is a perspective view of a light irradiation unit according to a fourth embodiment.
Figure 10:
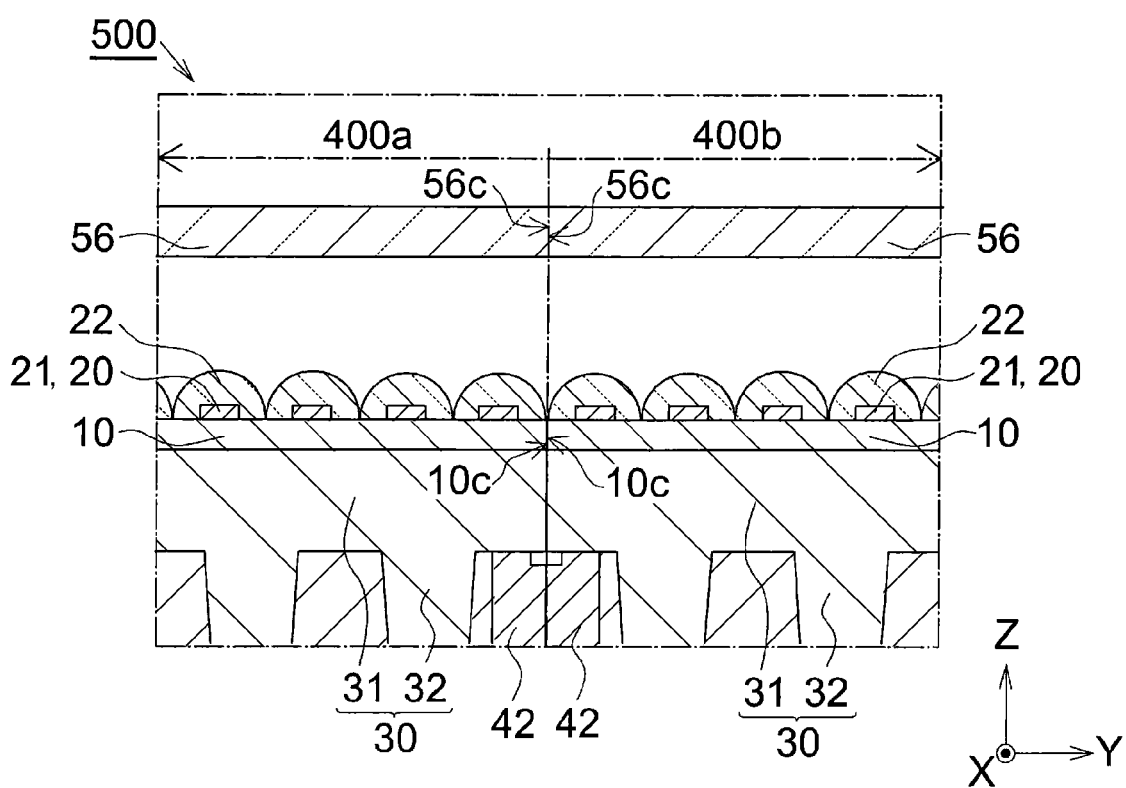
FIG. 10 illustrates a section of a connection region of light irradiation units in a light irradiation device in which the light irradiation units according to the fourth embodiment are connected, the section being parallel to the YZ plane.
Figure 11:
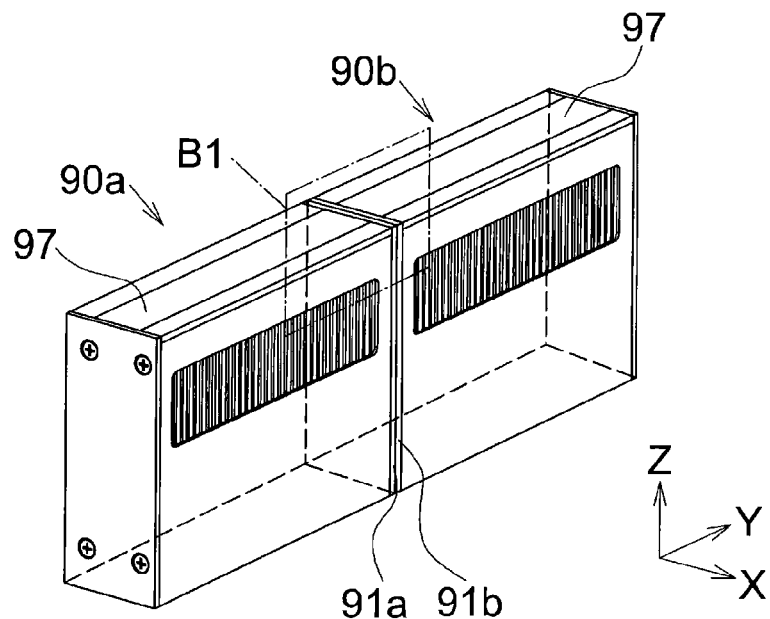
FIG. 11 is a perspective view of a light irradiation device in which existing light irradiation units are connected.
Figure 12:
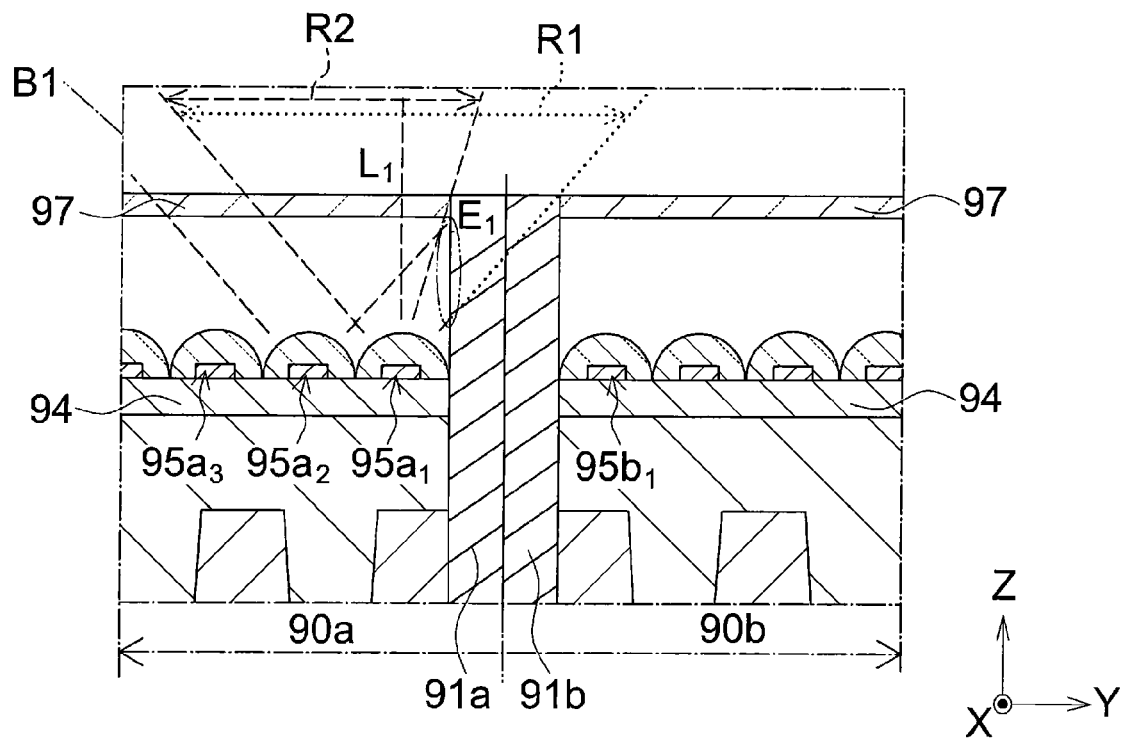
FIG. 12 is an enlarged view of the B1 region of FIG. 11.

With reference to FIG. 9 and FIG. 10, a light irradiation unit according to a fourth embodiment will be described. FIG. 9 is a perspective view of a light irradiation unit 400. In the light irradiation unit 400, a support member 54 supports the optical member 56 that transmits emission light from the light sources 20, from each of the +X side and the −X side of the optical member 56. The support member 54, however, does not support an end surface 56c of the optical member 56 in the Y-axis direction. The length of the optical member 56 in the Y-axis direction is identical to the length of the substrate 10 in the Y-axis direction. In the present embodiment, the optical member 56 is a cylindrical rod lens having the center along an axis parallel to the Y-axis direction. The optical member 56 is, however, not limited to having this shape.

FIG. 10 illustrates a section of a connection region of a light irradiation unit 400a and a light irradiation unit 400b in a light irradiation device 500 in which the light irradiation units (400a and 400b) identical to the light irradiation unit 400 are connected in the Y-axis direction, the section being parallel to the YZ plane. Respective optical members 56 of the light irradiation units (400a and 400b) adjacent to each other are in contact with each other such that the end surfaces 56c thereof abut each other. In the light irradiation device 500 according to the present embodiment, the frame (the region indicated with dots in FIG. 5), which is present at the connection part in the first embodiment, of the support member 53 that partially blocks emission light is not present. Therefore, illuminance uniformity of an irradiation area of the light irradiation device 500 is improved.

The first embodiment to the fourth embodiment have been described above. The present invention is, however, not limited to the above-described embodiments at all, and the above-described embodiments can be combined together without departing from the gist of the present invention. Moreover, various changes or modifications can be added to the embodiments and the combined embodiments without departing from the gist of the present invention. Examples of the embodiments or the combined embodiments that are changed or modified are presented below.

In the aforementioned embodiments, the multiple light sources 20 are arranged in one line along the Y-axis direction but may be arranged in multiple lines. When the multiple light sources 20 are to be arranged in multiple lines, a gap may be provided between the lines.

The above-described second side surfaces 42 are not necessarily essential. A housing in which the second side surfaces 42 themselves are not present may be employed, or the entirety of each second side surface 42 may be constituted by a detachable protection member.

In the pair of the side surfaces of the light irradiation unit, the side surfaces intersecting the Y-axis direction, one side surface may be a side surface having the configuration of the above-described second side surfaces 42, and the other side surface may be constituted by a housing that covers the entirety of the side surface and that is not easily detached. Such a light irradiation unit is usable as, for example, a light irradiation unit dedicated for end-portion arrangement in a light irradiation device in which light irradiation units are connected.

In the aforementioned embodiments, an example in which the number of the light irradiation units to be connected is two has been described; however, three or more light irradiation units may be connected. Light irradiation units to be connected are not limited to light irradiation units having the same specifications, and light irradiation units having different specifications may be connected.

What is claimed is:

1. A light irradiation unit comprising:
a substrate having a longitudinal direction, the longitudinal direction being a first axis direction;
multiple light sources arranged along the first axis direction on a first surface of the substrate;
a heat dissipation member arranged on a second surface of the substrate opposite to the first surface; and
a housing having a pair of first side surfaces that hold the heat dissipation member therebetween in a second axis direction orthogonal to the first axis direction along the first surface,
wherein the substrate has two ends, an end surface located at an end along the first axis direction, the end surface intersecting the first axis direction, a location of the end surface in the first axis direction being near an edge of the first side surfaces along the first axis direction, and
wherein the end surface is exposed from the housing or covered by a detachable protection member.

2. The light irradiation unit according to claim 1,
wherein the end surface is provided at each of the two ends of the substrate along the first axis direction, and
wherein the end surface provided at each of the two ends is exposed from the housing or covered by a detachable protection member.

3. The light irradiation unit according to claim according to claim 1,
wherein the housing has a second side surface in the first axis direction, the second side surface being arranged to cover at least a portion of the heat dissipation member and not to cover the substrate.

4. The light irradiation unit according to claim 3, wherein the second side surface includes two side surfaces in the first axis direction to hold at least a portion of the heat dissipation member therebetween.

5. The light irradiation unit according to according to claim 1,
wherein the multiple light sources are arranged at an interval of a (mm) in the first axis direction, and
wherein, when an interval in the first axis direction between the end surface that is exposed or covered by the detachable protection member and a center of, among the multiple light sources, a light source closest to the end surface is b (mm), a relationship of b=a/2 is satisfied.

6. The light irradiation unit according to according to claim 1, further comprising:
an optical member that is supported by a support member fixed to the housing or to the heat dissipation member and that transmits light emitted from the multiple light sources,
wherein a length of the optical member in the first axis direction is identical to a length of the substrate in the first axis direction.

7. A light irradiation device comprising light irradiation units, the light irradiation units being connected in the first axis direction, each of which is the light irradiation units comprising,
multiple light sources arranged along the first axis direction on a first surface of the substrate;
a heat dissipation member arranged on a second surface of the substrate opposite to the first surface; and
a housing having a pair of first side surfaces that hold the heat dissipation member therebetween in a second axis direction orthogonal to the first axis direction along the first surface,
wherein the substrate has two ends, an end surface located at an end portion along the first axis direction, the end surface intersecting the first axis direction, a location of the end surface in the first axis direction being near an edge of the first side surfaces along the first axis direction, and
wherein the end surfaces of the substrates arranged to face each other in the light irradiation units adjacent to each other are in contact with or close to each other in a state of each being exposed or in a state in which the protection members are detached.

8. The light irradiation device according claim 7,
wherein the light irradiation units each include an optical member that is supported by a support member fixed to the housing or to the heat dissipation member and that transmits light emitted from the multiple light sources, and
wherein the optical members of the light irradiation units adjacent to each other are in contact with each other.

9. A light irradiation device comprising light irradiation units each of which is the light irradiation unit according to claim 7, the light irradiation units being connected in the first axis direction,
wherein the end surfaces of the substrates arranged to face each other in the light irradiation units adjacent to each other are in contact with or close to each other in a state of each being exposed or in a state in which the protection members are detached, and
wherein the heat dissipation members of the light irradiation units adjacent to each other are in contact with each other.

* * * * *